US010290695B2

(12) United States Patent
Li et al.

(10) Patent No.: US 10,290,695 B2
(45) Date of Patent: May 14, 2019

(54) DISPLAY PANEL AND FABRICATION METHOD THEREOF

(71) Applicant: Shanghai Tianma AM-OLED Co., Ltd., Shanghai (CN)

(72) Inventors: Yujun Li, Shanghai (CN); Bengang Zhao, Shanghai (CN); Shucheng Luo, Shanghai (CN); Kaen Jiang, Shanghai (CN)

(73) Assignee: Shanghai Tianma AM-OLED Co., Ltd., Shanghai (CN)

(*) Notice: Subject to any disclaimer, the term of this patent is extended or adjusted under 35 U.S.C. 154(b) by 0 days.

(21) Appl. No.: 15/670,643

(22) Filed: Aug. 7, 2017

(65) Prior Publication Data

US 2017/0338297 A1 Nov. 23, 2017

(30) Foreign Application Priority Data

Apr. 28, 2017 (CN) .......................... 2017 1 0299353

(51) Int. Cl.

| | |
|---|---|
| ***H01L 27/32*** | (2006.01) |
| ***G02F 1/13*** | (2006.01) |
| ***H01L 51/52*** | (2006.01) |
| *H01L 51/00* | (2006.01) |
| *H05B 33/10* | (2006.01) |
| *G02F 1/1333* | (2006.01) |

(52) U.S. Cl.

CPC ........ *H01L 27/3283* (2013.01); *G02F 1/1303* (2013.01); *H01L 27/3288* (2013.01); *H01L 51/5212* (2013.01); *G02F 2001/133302* (2013.01); *G02F 2201/501* (2013.01); *G02F 2201/56* (2013.01); *H01L 51/0096* (2013.01); *H05B 33/10* (2013.01)

(58) Field of Classification Search

CPC .................................................. H01L 27/3283
See application file for complete search history.

(56) References Cited

U.S. PATENT DOCUMENTS

2015/0111625 A1* 4/2015 Huang ................. H04M 1/185 455/575.8

FOREIGN PATENT DOCUMENTS

| | | |
|---|---|---|
| CN | 104591531 A | 5/2015 |
| CN | 102448659 B | 10/2015 |

* cited by examiner

*Primary Examiner* — William A Harriston
(74) *Attorney, Agent, or Firm* — Anova Law Group, PLLC

(57) ABSTRACT

A display panel and a display panel fabrication method are provided. The display panel comprises a display region; and a peripheral circuit region surrounding the display region. The display panel has a display surface facing viewers and covering the display region and the peripheral circuit region. At least one corner of the display panel is provided with a chamfer having a chamfer surface, the chamfer surface is a new side surface which is going to be introduced to the display panel after the chamfer is formed. A chamfer cutting reflective layer is disposed on the display surface of the display panel and along an edge of the chamfer surface. In a direction perpendicular to a chamfer cutting line and towards the at least one corner of the display panel, a thickness of the chamfer cutting reflective layer is reduced.

19 Claims, 13 Drawing Sheets

DISPLAY PANEL AND FABRICATION METHOD THEREOF

CROSS-REFERENCES TO RELATED APPLICATIONS

This application claims the priority of Chinese Patent Application No. CN201710299353.X, filed on Apr. 28, 2017, the entire contents of which are incorporated herein by reference.

FIELD OF THE DISCLOSURE

The present disclosure generally relates to the display technology and, more particularly, relates to a display panel and a fabrication method thereof.

BACKGROUND

Nowadays, to reduce the overall weight and size of display panels and, meanwhile, provide a substantially large space to store the motherboard, camera, photo-sensor, and battery, etc., chamfer cuttings are often performed at the corners of the display panels. Chamfer cuttings are often performed by laser of 505-880 nm wavelength and a temperature of under 500-800° C. The high temperature generated during the laser cutting process may cause the display panel to become brittle at the chamfer area, generating cracks and collapses. Moreover, the thermal diffraction generated during the chamfering process may affect the nearby circuit components and degrade the display performance.

The disclosed display panel and fabrication method thereof are directed to solve one or more problems set forth above and other problems.

BRIEF SUMMARY OF THE DISCLOSURE

One aspect of the present disclosure provides a display panel. The display panel comprises a display region; and a peripheral circuit region surrounding the display region. The display panel has a display surface facing viewers and covering the display region and the peripheral circuit region. At least one corner of the display panel is provided with a chamfer having a chamfer surface, the chamfer surface is a new side surface which is going to be introduced to the display panel after the chamfer is formed. A chamfer cutting reflective layer is disposed on the display surface of the display panel and along an edge of the chamfer surface. In a direction perpendicular to a chamfer cutting line and towards the at least one corner of the display panel, a thickness of the chamfer cutting reflective layer is reduced.

Another aspect of the present disclosure provides a display panel fabrication method, comprising providing at least one corner of a display surface of the display panel with a chamfer cutting reflective layer; and laser cutting the display panel along a chamfer cutting line to form a chamfer. The chamfer cutting reflective layer is formed on the display surface of the display panel and along an edge of a chamfer surface, the chamfer surface being a new side surface which is going to be introduced to the display panel after the chamfer is formed. In a direction perpendicular to a chamfer cutting line and towards the at least one corner of the display panel, a thickness of the chamfer cutting reflective layer is reduced.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention. Further, in the present disclosure, the disclosed embodiments and the features of the disclosed embodiments may be combined under conditions without conflicts.

The present disclosure provides an improved display panel and display panel fabrication method thereof, which may be able to suppress the brittle and collapse of the display panel at the chamfer region, as well as the damage to the peripheral circuit caused by the laser scattering during the chamfer cutting process.

Figure 1A:
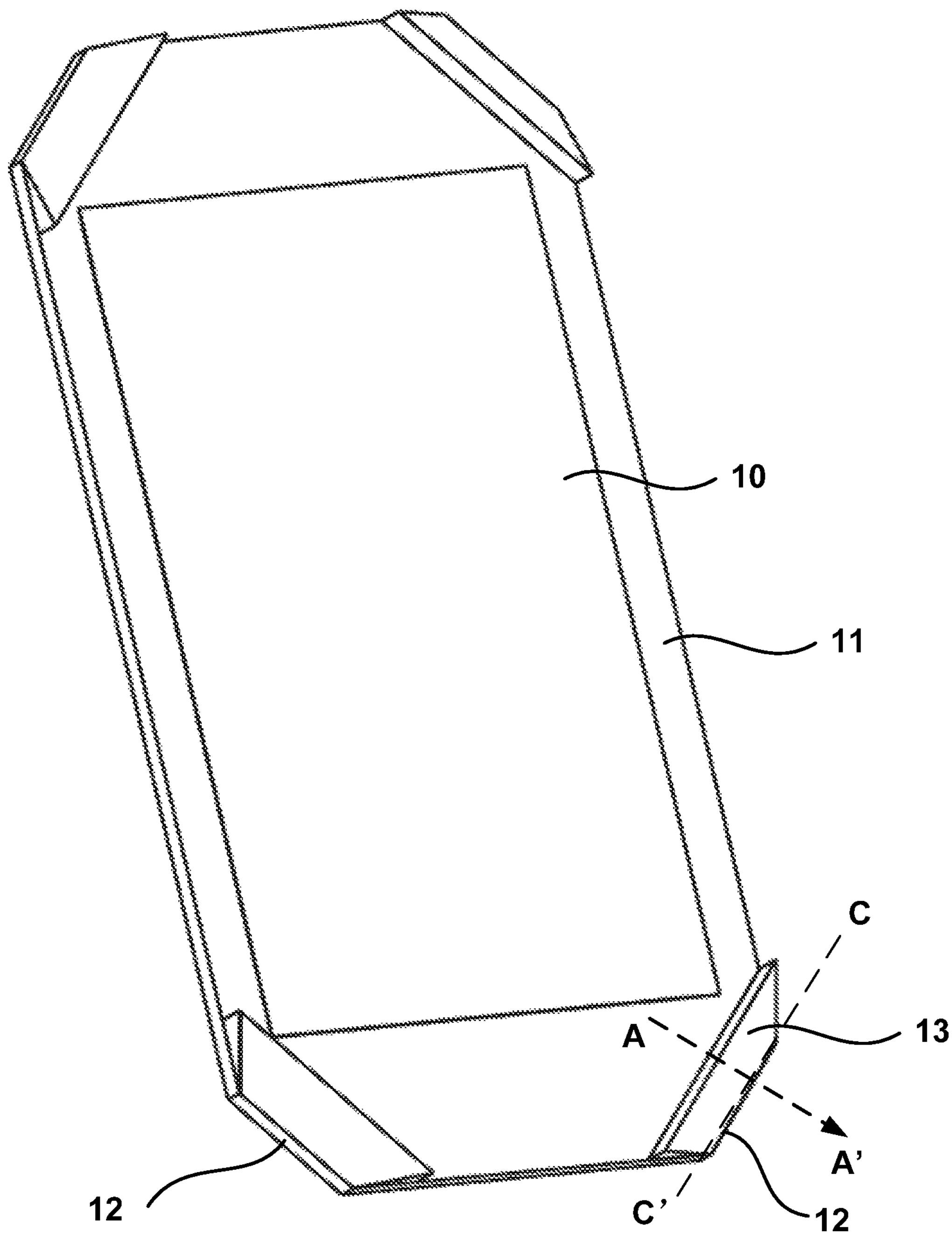
FIG. 1A illustrates a schematic view of an exemplary display panel consistent with the disclosed embodiments.
Figure 1B:
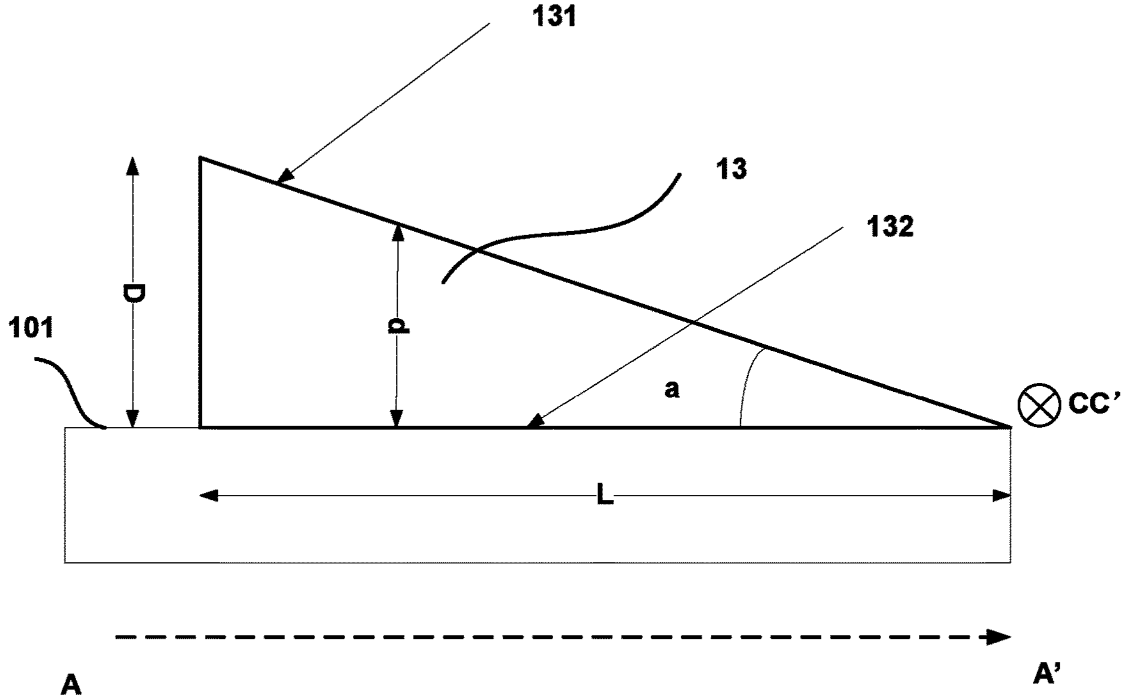
FIG. 1B illustrates an AA' sectional view of an exemplary display panel in FIG. 1A consistent with the disclosed embodiments.

The present disclosure first provides a display panel. FIG. 1A illustrates a schematic view of an exemplary display panel consistent with the disclosed embodiments. FIG. 1B illustrates an AA' sectional view of an exemplary display panel in FIG. 1A consistent with the disclosed embodiments.

As shown in FIG. 1A and FIG. 1B, the display panel may include a display region 10 and a peripheral circuit region 11 (i.e., a non-display region) surrounding the display region 10. In particular, at least one corner of the display panel may be disposed with a chamfer 12 (for illustrative purposes, chamfers are formed at four corners of the display panel in FIG. 1A). For convenience of description, in FIG. 1A, the chamfer surface formed after chamfering is also referred as a chamfer, and is labeled with the reference number 12. The chamfer surface is a new side surface of the display panel which is going to be introduced to the display panel after the chamfer is formed.

The display panel may have a display surface 101 facing viewers, and the display surface 101 may cover the display region 10 and the peripheral circuit region 11. A chamfer cutting reflective layer 13 may be formed on the display surface 101 of the display panel and along an edge (i.e., the edge on the display surface 101) of the chamfer surface 12. The chamfer cutting reflective layer 13 may have a lower surface 132 facing the display panel (or disposed on the display surface 101), and an opposite upper surface 131 far away from the display panel. A vertical distance between the upper surface 131 and lower surface 132 of the chamfer cutting reflective layer 13 is referred as a thickness d of the chamfer cutting reflective layer 13. To form the chamfer 12 at the corner of the display panel, a chamfer cutting device often cuts the display panel along a chamfer cutting line CC' on the display panel, in which the chamfer cutting line CC' may be an intersection between the chamfer surface 12 and the display surface 101 of the display panel. The corner of the display panel is to be cut off from the display panel at the chamfer cutting line CC'. The chamfer cutting line CC' may be a straight line.

In particular, in a direction perpendicular to the chamfer cutting line CC' and towards the corner of the display panel, e.g., in the AA' direction shown in FIG. 1A, the thickness d of the chamfer cutting reflective layer 13 may be gradually reduced.

Chamfer cutting often requires a laser, however, the high temperature generated during the laser cutting process may cause the display panel to become brittle near the chamfer cutting line CC', generating cracks and collapses.

Figure 1C:
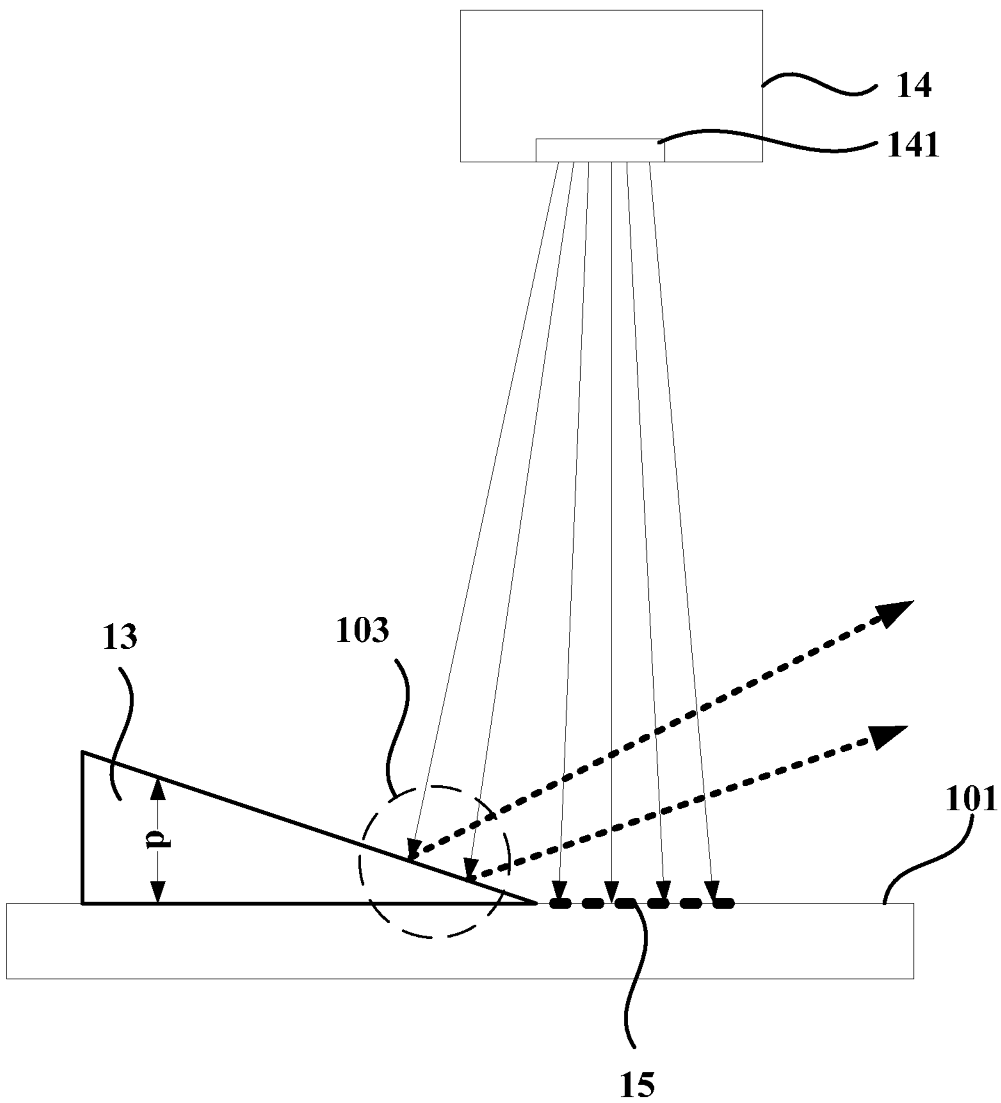
FIG. 1C illustrates a schematic view of an exemplary chamfer cutting consistent with the disclosed embodiments.

FIG. 1C illustrates a schematic view of an exemplary chamfer cutting consistent with the disclosed embodiments. As shown in FIG. 1C, the chamfer cutting reflective layer 13 may be formed on the display surface 101 of the display panel and along the edge of the chamfered surface. In the direction perpendicular to the chamfer cutting line and towards the corners of the display panel, the thickness d of the chamfer cutting reflective layer 13 may be gradually reduced. During the laser cutting process, the laser light emitted from a light source 141 of a chamfer cutting device 14 may be partially irradiated onto a chamfer cutting line 15, and partially irradiated onto areas 103 of the display panel close to but beyond the chamfer cutting line 15. The laser light irradiated onto the areas 103 of the display panel beyond the chamfer cutting line 15 may cause the display panel to become brittle at the areas 103, generating cracks and collapses.

However, in the disclosed embodiments, the chamfer cutting reflective layer 13 may effectively reflect the laser light, which is irradiated onto the areas 103 of the display panel beyond the chamfer cutting line 15, to the outside of the display panel (as denoted by the dashed arrows in FIG. 1C). Thus, the areas 103 of the display panel close to but beyond the chamfer cutting line 15 may be prevented from becoming brittle, thereby suppressing the cracks and collapses. Moreover, the nearby circuit components may be prevented from being affected by the thermal diffraction generated during the chamfer cutting process, and the display performance may be no longer degraded.

Figure 1D:
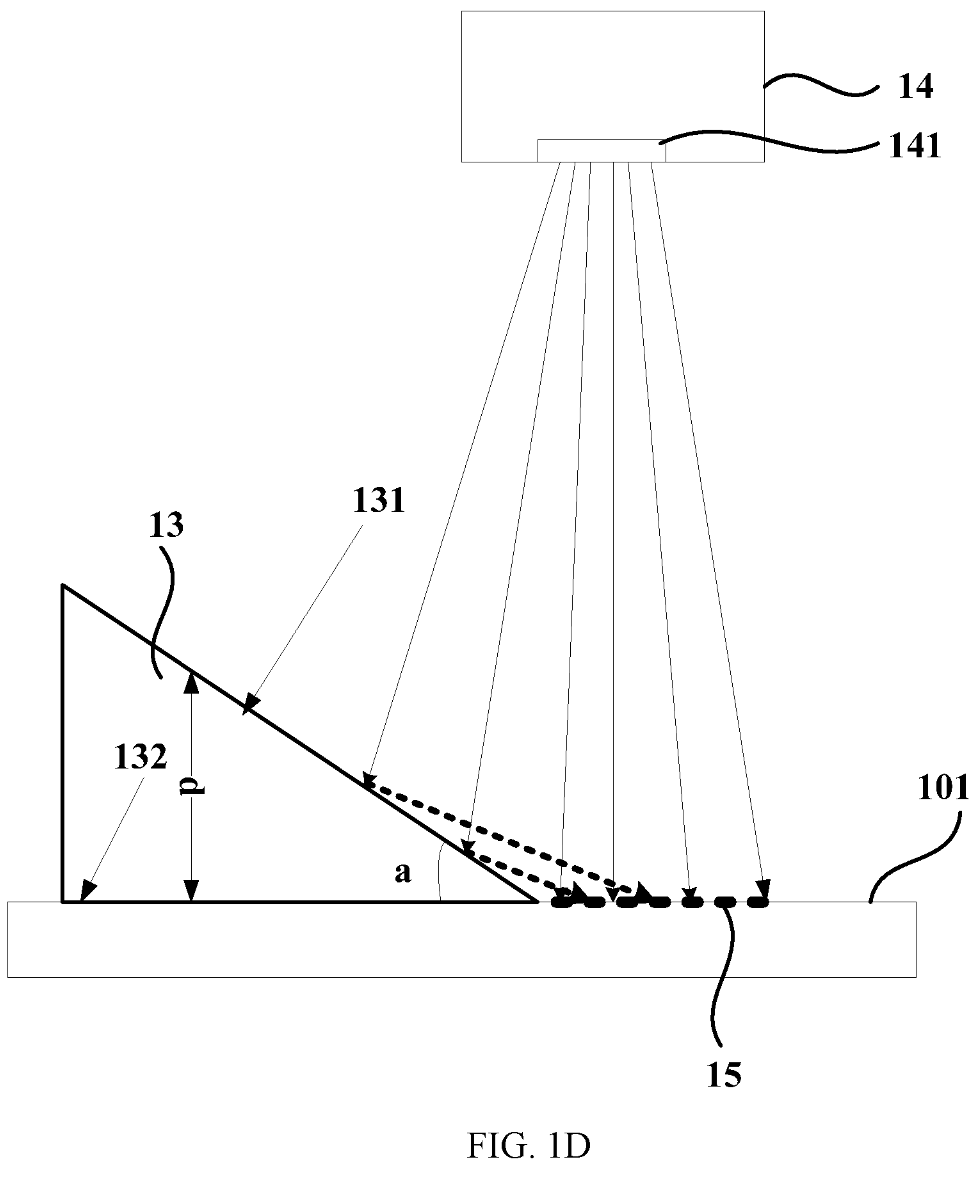
FIG. 1D illustrates a schematic view of another exemplary chamfer cutting consistent with the disclosed embodiments.

In one embodiment, as shown in FIG. 1D, the chamfer cutting reflective layer 13 may have the lower surface 132 facing the display surface 101 of the display panel, and the upper surface 131 far away from the display surface 101 of the display panel. The upper surface 131 of the chamfer cutting reflective layer 13 may be configured to be a slope. An angle $\alpha$ between the upper surface 131 and the lower surface 132 of the chamfer cutting reflective layer 13 may be approximately in a range of [30°, 45°], which may enable the chamfer cutting reflective layer 13 to reflect and converge the incident laser to the chamfer cutting line 15 on the display panel (as denoted by the dashed arrows in FIG. 1D). Thus, the laser emitted from the light source 141 of the chamfer cutting device 141 may be sufficiently utilized, thereby improving the utilization of the laser and the accuracy of the chamfer cutting.

Figure 1E:
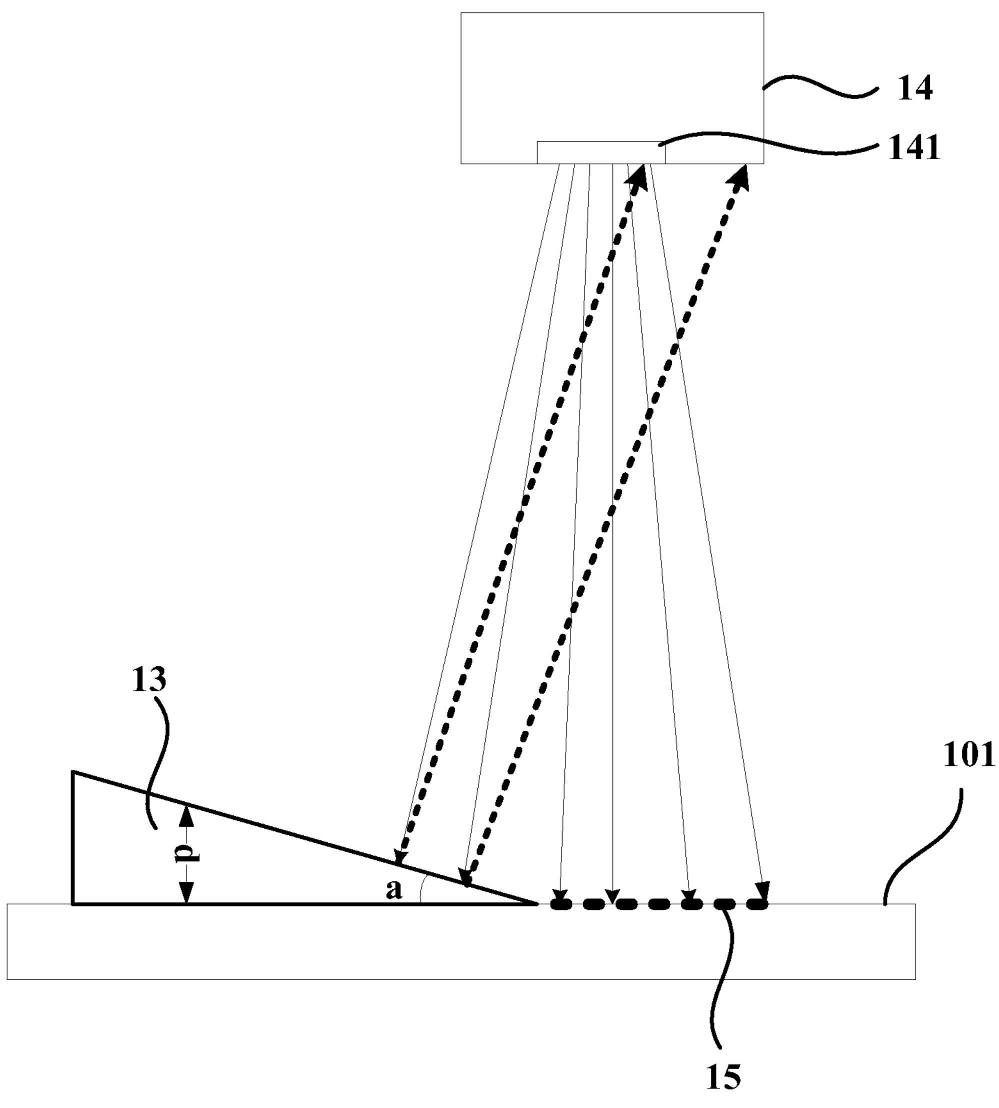
FIG. 1E illustrates a schematic view of another exemplary chamfer cutting consistent with the disclosed embodiments.

When the angle $\alpha$ is too large or too small, for example, as shown in FIG. 1E, the chamfer cutting reflective layer 13 may reflect the incident laser to the chamfer cutting device 141 (as denoted by the dashed arrows in FIG. 1E) which may disturb the chamfer cutting device 141, or may reflect the incident laser to somewhere else which may cause a laser burn on operators and raise security risks.

In one embodiment, as shown in FIG. 1B, a maximum thickness D between the upper surface 131 and the lower surface 132 of the chamfer cutting reflective layer 13 may be approximately in a range of [0.3 um, 2 um]. When the maximum thickness D is too small, the inclination angle of the upper surface 131 of the chamfer cutting reflective layer 13 may be substantially small. That is, the angle $\alpha$ between the upper surface 131 and the lower surface 132 of the chamfer cutting reflective layer 13 may be substantially small, which may reduce the light reflection of the chamfer cutting reflective layer 13 in the chamfer cutting process.

On the other hand, the various films formed during the fabrication process of the display panel often have a thickness in the order of microns, when the maximum thickness D is too large, the chamfer cutting reflective layer 13 may not be fabricated by the film fabrication process of the existing display panel. That is, an additional film fabrication process may have to be introduced to fabricate the chamfer cutting reflective layer 13, which may increase the steps of the fabrication process as well as the fabrication cost.

Further, as shown in FIG. 1B, on the display surface 101 of the display panel, the lower surface 132 of the chamfer cutting reflective layer 13 has a length L in the direction perpendicular to the edge of the chamfer surface 12 (i.e., in the direction perpendicular to the chamfer cutting line CC', e.g., in the AA' direction shown in FIG. 1A and FIG. 1B). The length L may be configured to be approximately in a range of [200 um, 500 um].

When the length L is too small, the laser emitted from the chamfer cutting device may be incident onto areas of the display panel outside the chamfer cutting reflective layer 13, such that the laser incident onto the areas of the display panel outside the chamfer cutting reflective layer 13 may be unable to be reflected to the outside of the display panel by the cutting reflective layer 13. When the length L is too large, the border width of the display panel may be increased, which may not satisfy the development trend of narrow borders in the existing display panels.

It should be noted that, the display panel may include any appropriate type of display panels capable of displaying videos and/or images, such as plasma display panels, field emission display panels, organic light-emitting diode (OLED) display panels, light-emitting diode (OED) display panels, liquid crystal display (LCD) panels, quantum dots (QDs) display panels, electrophoretic display panels, etc. Moreover, the number and the shape of the chamfers shown in FIGS. 1A and 2B are for illustrative purposes, which are not intended to limit the scope of the present disclosure. In practical applications, the number and the shape of the chamfers in the display panels may be determined according to various application scenarios.

Figure 2:
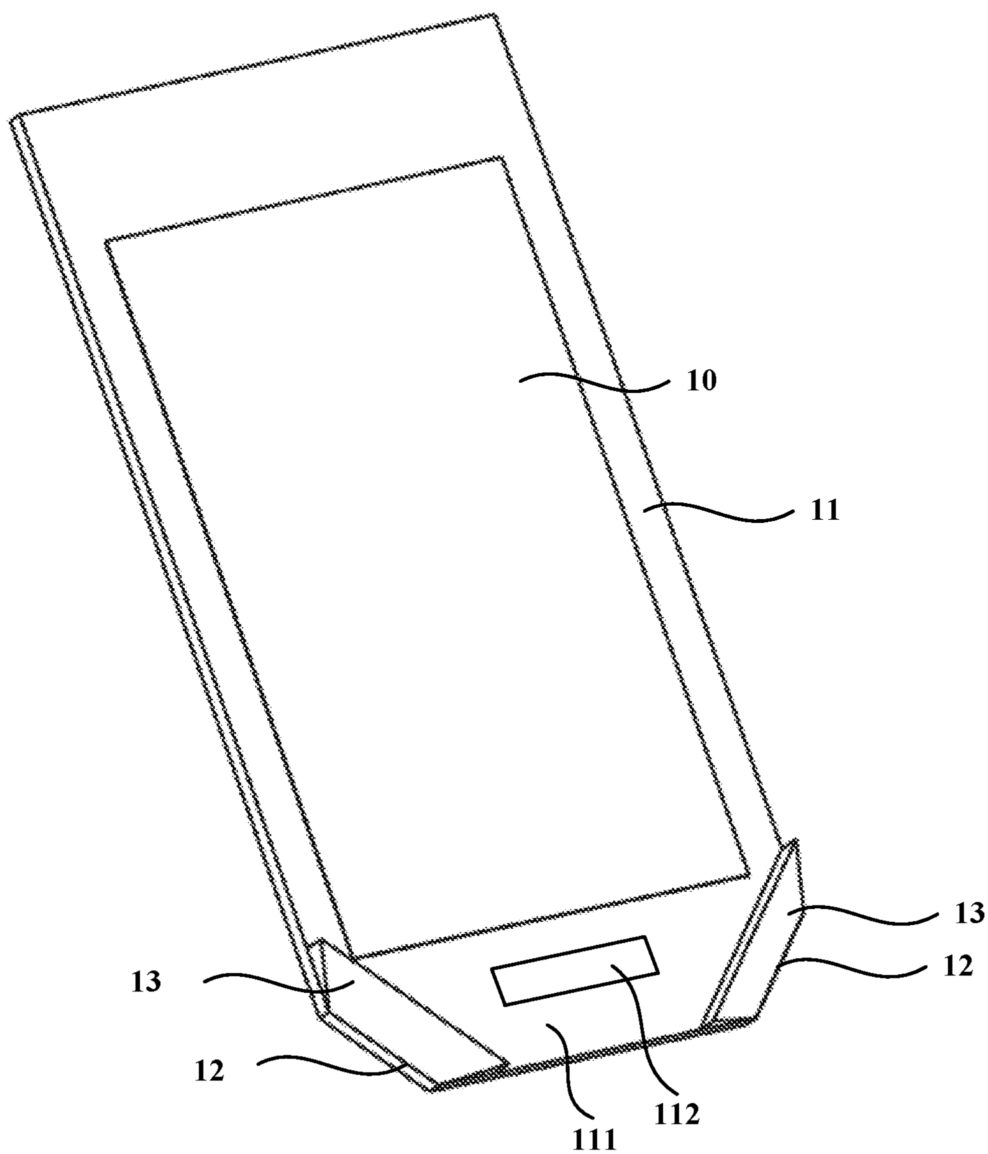
FIG. 2 illustrates a schematic view of another exemplary display panel consistent with the disclosed embodiments.

FIG. 2 illustrates a schematic view of another exemplary display panel consistent with the disclosed embodiments. The similarities between FIG. 1A and FIG. 2 are not repeated here, while certain differences may be explained. As shown in FIG. 2, the peripheral circuit region 11 of the display panel may comprise at least a chip holder 111, and a driving chip 112 may be disposed in the chip holder 111. The chamfers 12 may be formed at two corners of the display panel corresponding to the chip holder 111. The chamfer cutting reflective layer 13 may be formed on the display surface of the display panel and along the edge of the chamfer surface.

Figure 3A:
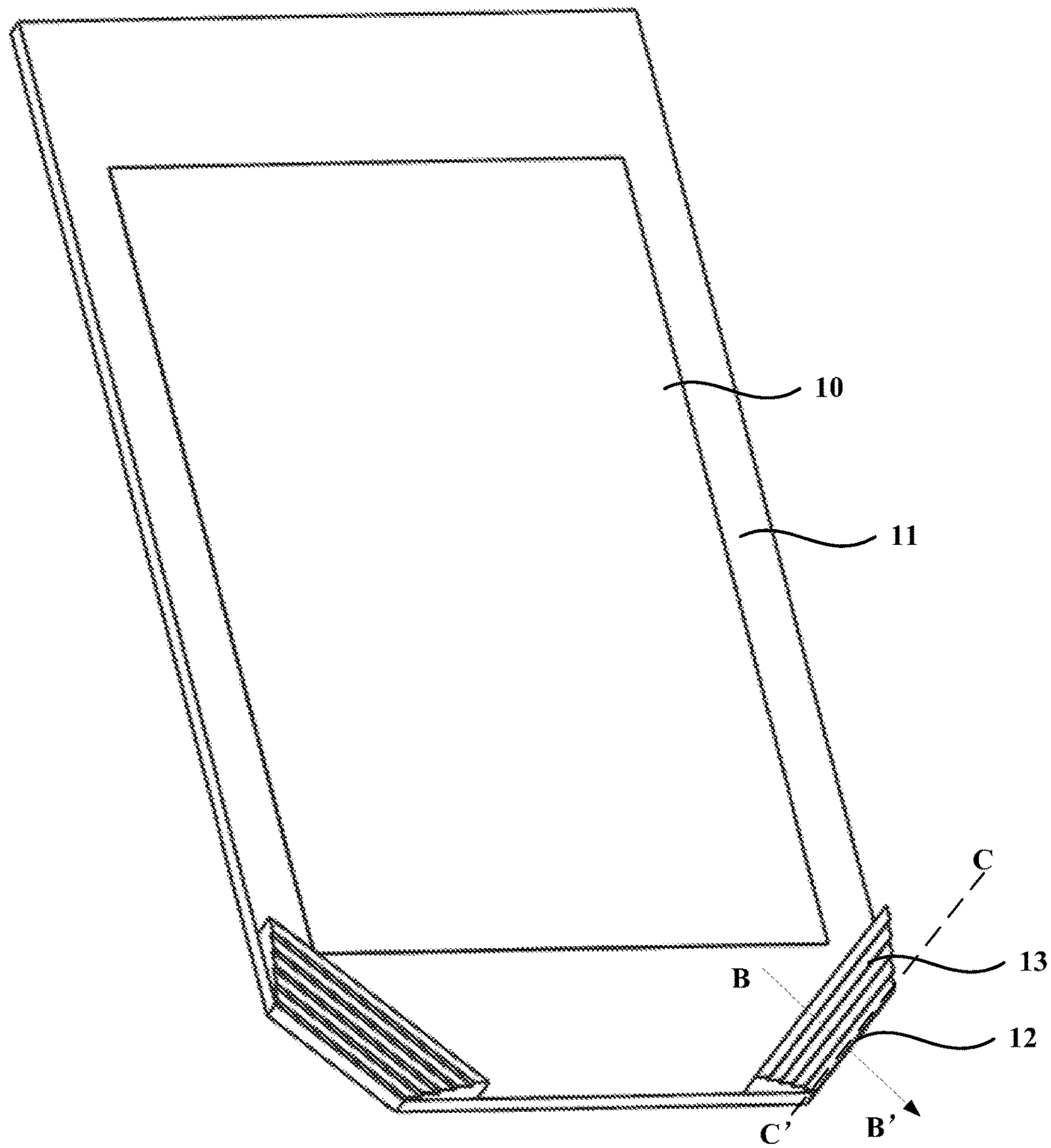
FIG. 3A illustrates a schematic view of another exemplary display panel consistent with the disclosed embodiments.
Figure 3B:
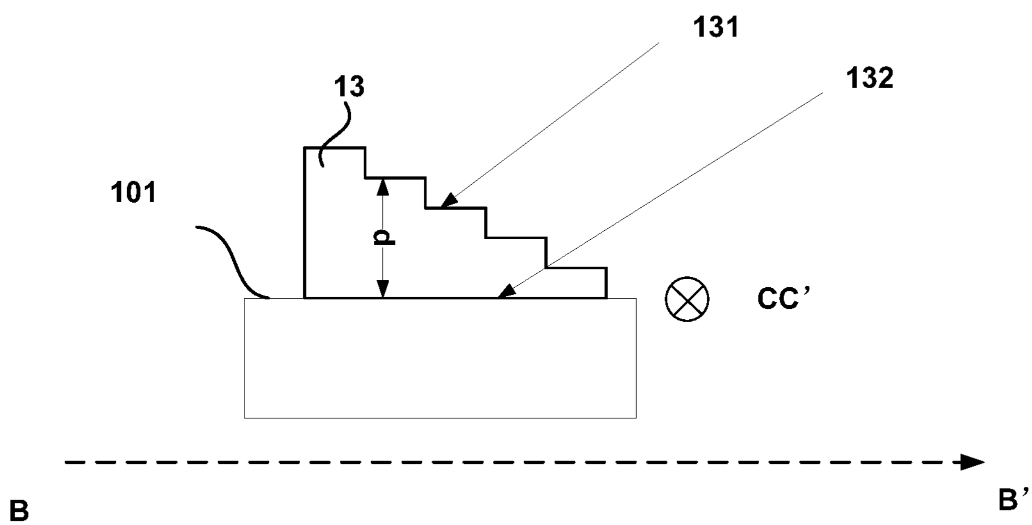
FIG. 3B illustrates an BB' sectional view of another exemplary display panel in FIG. 3A consistent with the disclosed embodiments.

FIG. 3A illustrates a schematic view of another exemplary display panel consistent with the disclosed embodiments, and FIG. 3B illustrates an BB' sectional view of an exemplary display panel in FIG. 3A consistent with the disclosed embodiments. The similarities between FIG. 1A and FIG. 3A, and the similarities between FIG. 1B and FIG. 3B are not repeated here, while certain differences may be explained.

As shown in FIG. 3A and FIG. 3B, the display panel may include a display region 10 and a peripheral circuit region 11 surrounding the display region 10. In particular, at least one corner of the display panel may be disposed with the chamfer 12. For illustrative purposes, chamfers are formed at two corners of the display panel in FIG. 3A. In a direction perpendicular to the chamfer cutting line CC' and towards the corners of the display panel, e.g., in the BB' direction shown in FIG. 3A, the thickness d of the chamfer cutting reflective layer 13 may be gradually reduced.

As shown in FIG. 3B, the upper surface 131 of the chamfer cutting reflective layer 13 may be configured to have a stepped shape, called as a stepped chamfer cutting reflective layer 13. The stepped surface may diffuse the laser beam which is incident onto the stepped surface, i.e., the reflected light is scattered equally in all directions. Thus, on one hand, the stepped chamfer cutting reflective layer 13 may effectively reflect the laser, which is irradiated onto the areas of the display panel beyond the chamfered cutting line, to the outside of the display panel, preventing the display panel from becoming brittle and from generating cracks and collapses. On the other hand, the stepped chamfer cutting reflective layer 13 may suppress the mirror reflection at the chamfer cutting reflective layer 13. Accordingly, the chamfer cutting device 14 may be prevented from being disturbed by the mirror reflection at the chamfer cutting reflective layer 13, and the security risks raised by the high laser heat generated by the mirror reflection at the chamfer cutting reflective layer 13 may be reduced.

In addition, the stepped chamfer cutting reflective layer may be easy to be fabricated, for example, through a step-by-step etching by using a photo mask, i.e., the film may be etched step-by-step through a mask plate, or a step-by-step deposition, i.e., the films may be deposited step-by-step through a mask plate.

In one embodiment, the chamfer cutting reflective layer may be formed by introducing an extra fabrication process, i.e., introducing an extra fabrication process in addition to the existing fabrication process of the display panels. In particular, the chamfer cutting reflective layer may be made of reflective metal materials, such as silver, and the melting point of the reflective materials may be selected to be above approximately 300° C., such that the chamfer cutting reflective layer may not be melted by the laser in the chamfer cutting process.

In another embodiment, the chamfer cutting reflective layer may be formed simultaneously in the existing fabrication process of the display panels. For example, when the display panel is an OLED display panel comprising a plurality of organic light-emitting units, the chamfer cutting reflective layer may be disposed on the same layer as the reflective electrode of the organic light-emitting unit (which is often the anode of the organic light-emitting unit). That is, the reflective electrode of the organic light-emitting unit and the chamfer cutting reflective layer may be made of the same material in the same fabrication process.

For example, the reflective electrode of the organic light-emitting unit may include a first transparent conductive layer (e.g., made from indium tin oxide ITO), a metal electrode layer (e.g., made from Ag), and a second transparent conductive layer (e.g., made from ITO) sequentially disposed. The reflective electrode of the organic light-emitting unit and the chamfer cutting reflective layer may be fabricated in the same fabrication process, and the chamfer cutting reflective layer may also include three layers, i.e., the first transparent conductive layer (e.g., made from indium tin oxide ITO), the metal electrode layer (e.g., made from Ag), and the second transparent conductive layer (e.g., made from ITO) sequentially disposed.

In another embodiment, when the display panel is an OLED display panel comprising a plurality of organic light-emitting units, the chamfer cutting reflective layer may be disposed in the same layer as any one of the metal layers in a pixel driving circuit of the organic light-emitting unit. In the OLED display panel, the organic light-emitting units may be one-to-one corresponding to the pixel driving circuits. The chamfer cutting reflective layer may be formed by an existing fabrication process of the pixel driving circuit of the organic light-emitting unit, and the chamfer cutting reflective layer may be disposed in the same layer as any one of the metal layers in a pixel driving circuit of the organic light-emitting unit. For example, the chamfer cutting reflective layer may be fabricated by the same materials in the same fabrication process as any one of the source/drain of the thin-film-transistor (TFT), the gate of the TFT, and the capacitor metal plate layer in the pixel driving circuit of the organic light-emitting unit.

In another embodiment, the display panel may also be a LCD panel including a plurality of TFTs, each of which is electrically connected to a pixel electrode of the pixel unit in the LCD panel. The chamfer cutting reflective layer may be provided in the same layer as any one of the metal electrodes of the TFT. To simplify the fabrication process, improve the production efficiency, and lower the cost, the chamfer cutting reflective layer may be formed simultaneously by the existing process for fabricating any one of the metal electrodes of the TFT in the display panels. For example, the source and drain electrodes of the TFT and the chamfer cutting reflection layers may be made of the same material in the same fabrication process.

Figure 4:
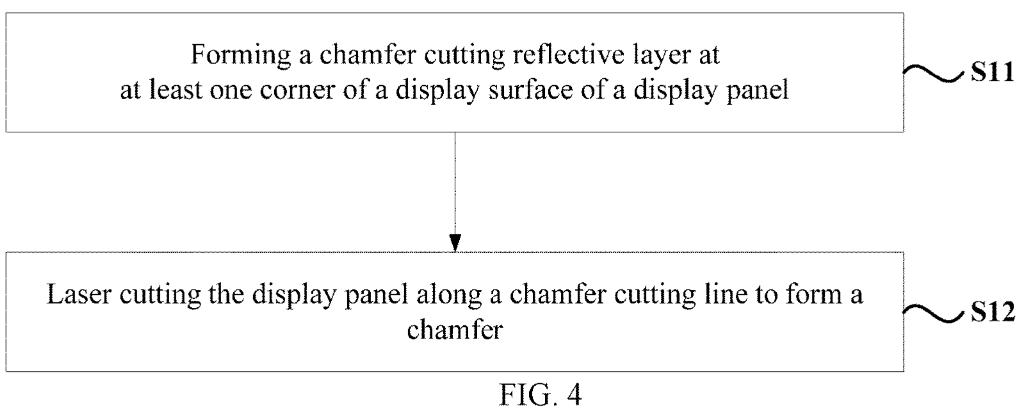
FIG. 4 illustrates a flow chart of an exemplary display panel fabrication method consistent with the disclosed embodiments.

Further, the present disclosure also provides a display panel fabrication method. FIG. 4 illustrates a flow chart of an exemplary display panel fabrication method consistent with the disclosed embodiments.

As shown in FIG. 4, at the beginning, at least one corner of the display surface of the display panel is provided with a chamfer cutting reflective layer (S11).

Figure 5A:
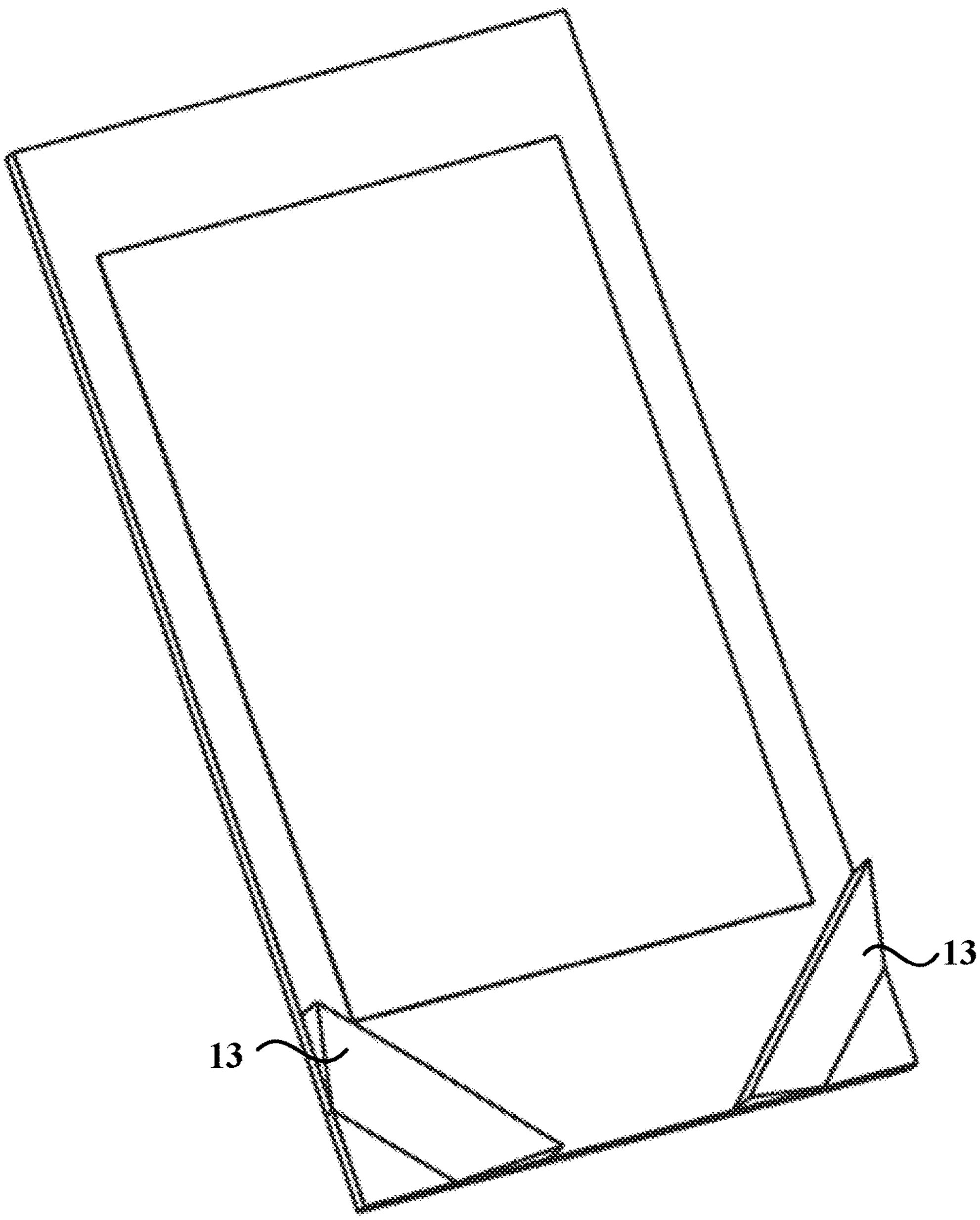
FIG. 5A illustrates a schematic views of an exemplary display panel during Step S11 of the fabrication method in FIG. 4 consistent with disclosed embodiments.

FIG. 5A illustrates a schematic views of an exemplary display panel during Step S11 of the fabrication method in FIG. 4 consistent with disclosed embodiments. As shown in FIG. 5A, for illustrative purposes, two corners of the display surface of the display panel each may be provided with a chamfer cutting reflective layer 13.

Returning to FIG. 4, after the chamfer cutting reflective layer is formed at the corner of the display surface of the display panel, the display panel is laser cut along the chamfer cutting line to form a chamfer (S12).

Figure 5B:
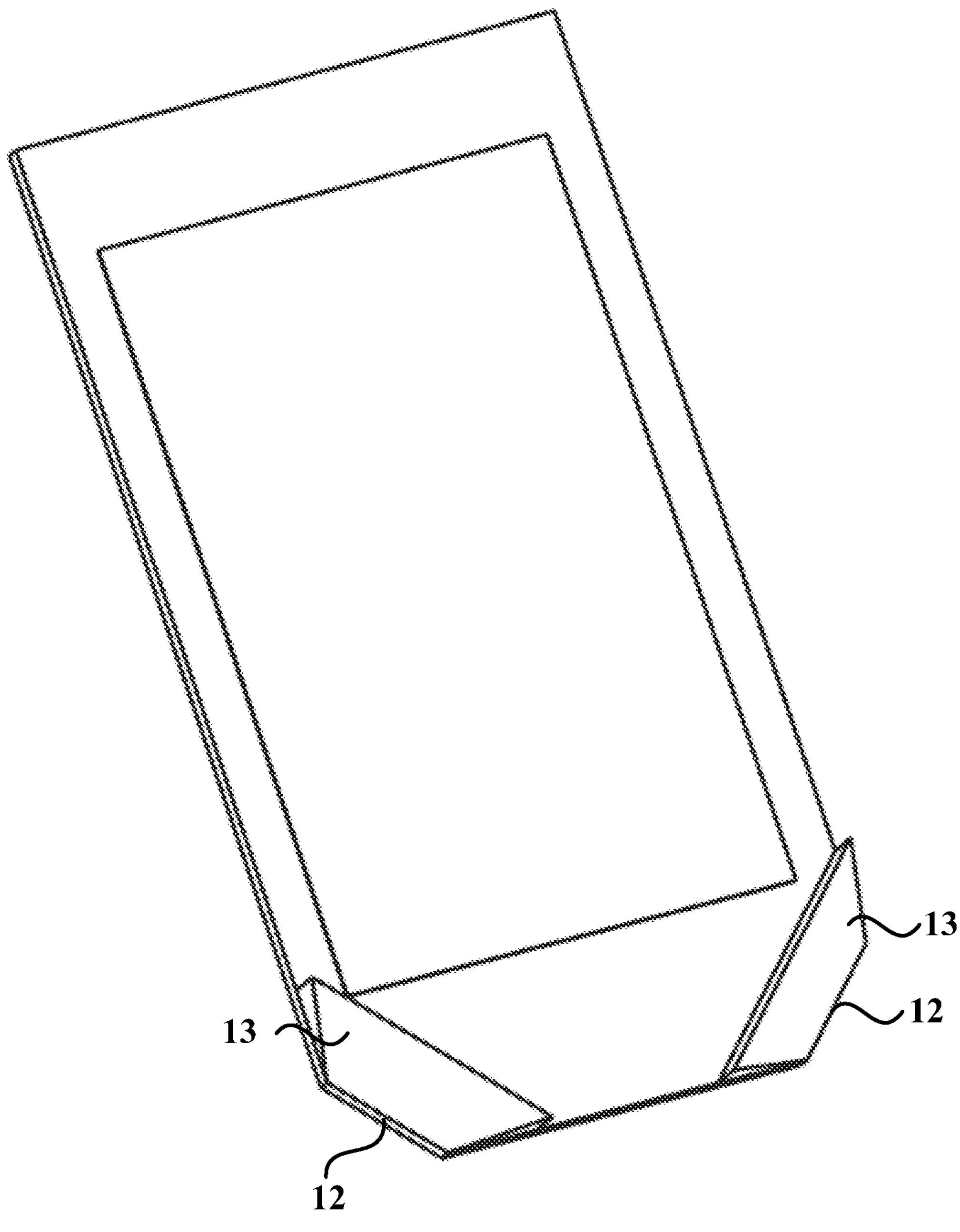
FIG. 5B illustrates a schematic views of an exemplary display panel during Step S12 of the fabrication method in FIG. 4 consistent with disclosed embodiments.

FIG. 5B illustrates a schematic views of an exemplary display panel during Step S12 of the fabrication method in FIG. 4 consistent with disclosed embodiments. As shown in FIG. 5B, a chamfer is formed by laser cutting the display panel.

In particular, the chamfer cutting reflective layer 13 may be provided on the display surface of the display panel and along the edge of the chamfer surface 12. In a direction perpendicular to the chamfer cutting line and towards the corners of the display panel, the thickness of the chamfer cutting reflective layer 13 may be gradually reduced.

In the disclosed display panel fabrication method, before laser cutting the display panel to form the chamfer, at least one corner of the display surface of the display panel may be disposed with the chamfer cutting reflective layer. Meanwhile, in the direction perpendicular to the chamfer cutting line and towards the corners of the display panel, the thickness of the chamfer cutting reflective layer may be gradually reduced. Thus, during the laser cutting process, the chamfer cutting reflective layer 13 may effectively reflect the laser, which is irradiated onto the areas of the display panel beyond the chamfered cutting line, to the outside of the display panel. Thus, the areas close to but beyond the chamfer cutting line 15 may be prevented from becoming brittle, and from generating cracks and collapses. Moreover, the nearby circuit components may be prevented from being affected by the thermal diffraction generated during the chamfer cutting process, and the display performance may be no longer degraded.

In one embodiment, at least one corner of the display surface of the display panel may be disposed with the chamfer cutting reflective layer by a halftone mask method, and the upper surface of the chamfer cutting reflective layer may be configured to be a slope.

Figure 6:
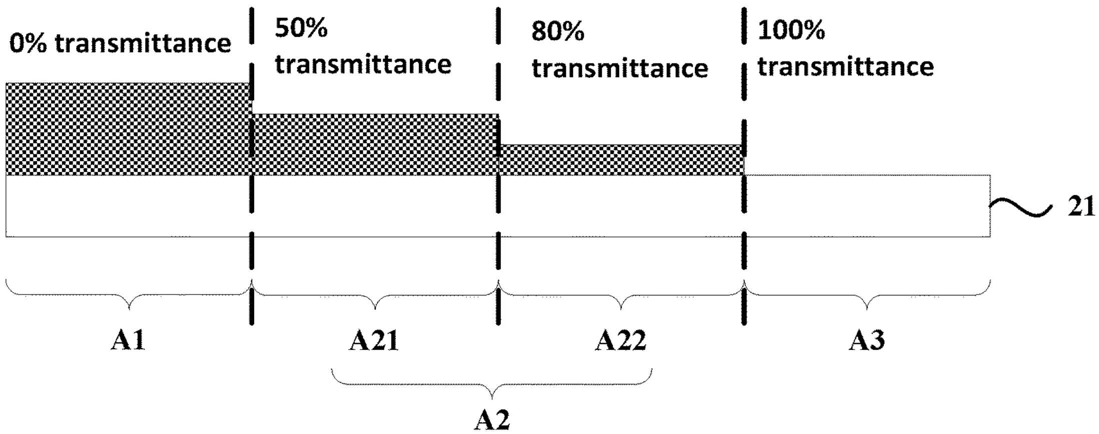
FIG. 6 illustrates a schematic view of an exemplary halftone mask consistent with disclosed embodiments.

FIG. 6 illustrates a schematic view of an exemplary halftone mask consistent with disclosed embodiments. As shown in FIG. 6, the halftone mask may include a substrate 21, and an opaque region A1, a semi-transparent region A2, and a transparent region A3 disposed on the substrate 21. The opaque region A1, the semi-transparent region A2, and the transparent region A3 may be formed by disposing light-shielding materials with different thickness in different regions on the substrate 21, or by disposing materials with different light transmittance in different regions on the substrate 21. The substrate 21 may be, for example, a transparent substrate such as quartz, capable of completely projecting light of a predetermined wavelength range. However, the substrate 21 is not limited to quartz, and may include any transparent materials.

The semi-transparent region A2 may comprise one or more semi-transparent portions, such that light may be transmitted through the semi-transparent portions with different transmittance then incident onto the substrate 21. The semi-transparent region A2 may be partially transparent to the ultraviolet light during the exposure process in the photolithography process.

FIG. 6 illustratively shows two semi-transparent portions A21 and A22. For example, the light transmittance of the opaque region A may be approximately 0%, the light transmittance of the semi-transparent portion A21 may be approximately 50%, the light transmittance of the semi-transparent portion A22 may be approximately 80%, and the light transmission of the transparent region A3 may be approximately 100%. Based on the halftone mask in FIG. 6, after the exposure, development and etching process are sequentially performed, different regions of the uniform-thickness film may be etched to different thickness, thereby forming a slope. The disclosed chamfer cutting reflective layer may be formed by the halftone mask shown in FIG. 6, such that the upper surface of the chamfer cutting reflective layer may be configured to have a slope shape.

In another embodiment, when a plurality of metal films are formed in the display region of the display panel, at least one corner of the display surface of the display panel may be disposed with the chamfer cutting reflective layer simultaneously. In particular, the upper surface of the chamfer cutting reflective layer may have a stepped shape.

Figure 7:
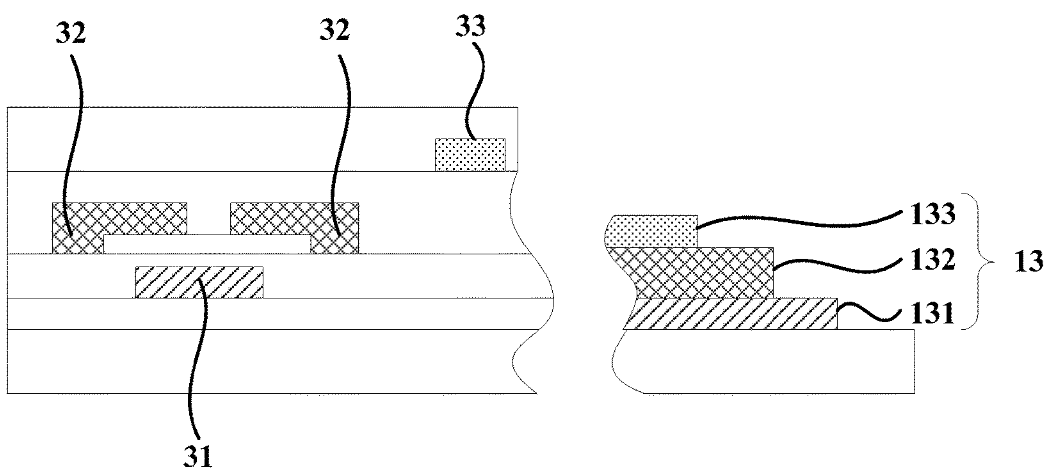
FIG. 7 illustrates a cross-sectional view of an exemplary chamfer cutting reflective layer formed by an exemplary display panel fabrication method consistent with disclosed embodiments.

FIG. 7 illustrates a cross-sectional view of an exemplary chamfer cutting reflective layer formed by an exemplary display panel fabrication method consistent with disclosed embodiments. As shown in FIG. 7, when a gate metal layer 31 is formed in the display region of the display panel, at least one corner of the display surface of the display panel may be disposed with a first metal layer 131 of the chamfer cutting reflective layer 13 simultaneously; when a source/drain metal layer 32 is formed in the display region of the display panel, at least one corner of the display surface of the display panel may be disposed with a second metal layer 132 of the chamfer cutting reflective layer 13 simultaneously; when a touch control wiring metal layer 33 is formed in the display region of the display panel, at least one corner of the display surface of the display panel may be disposed with a third metal layer 133 of the chamfer cutting reflective layer 13 simultaneously.

The first metal layer 131 of the chamfer cutting reflective layer 13 and the gate metal layer 31 in the display region may be fabricated by the same material in the same process. The second metal layer 132 of the chamfer cutting reflective layer 13 and the source/drain metal layer 32 in the display region may be fabricated by the same material in the same process. The third metal layer 133 of the chamfer cutting reflective layer 13 and the touch control wiring metal layer 33 in the display region may be fabricated by the same material in the same process.

The first metal layer 131, the second metal layer 132, and the third metal layer 133 of the chamfer cutting reflective layer 13 may be stacked to form a stepped shape, i.e., the upper surface of the chamfer cutting reflective layer 13 may be configured to have a stepped shape. FIG. 7 schematically shows simultaneously forming the chamfer cutting reflective layer and various metal layers of the TFT.

In another embodiment, the chamfer cutting reflective layer and any one of the metal layers in the display region of the display panel may be formed simultaneously. For example, when the display panel is an OLED display panel, the chamfer cutting reflective layer may be simultaneously formed on the same layer as any one of the metal layers in a pixel driving circuit of the organic light-emitting unit. The chamfer cutting reflective layer may be formed by the existing fabrication process of the pixel driving circuit of the organic light-emitting unit, and the chamfer cutting reflective layer may be disposed in the same layer as any one of the metal layers in the pixel driving circuit of the organic light-emitting unit. For example, the chamfer cutting reflective layer may be fabricated by the same materials in the same fabrication process as any one of the source/drain of the TFT, the gate of the TFT, and capacitor metal plate layers in the pixel driving circuit of the organic light-emitting unit.

In another embodiment, when a plurality of films are formed in the display region of the display panel, at least one corner of the display surface of the display panel may be simultaneously fabricated with a chamfer area having a stepped shape (i.e., stepped chamfer area). The chamfer cutting reflective layer may be formed on the stepped chamfer area, and the upper surface of the chamfer cutting reflective layer may also have a stepped shape. An exemplary structure is shown in FIG. 8.

Figure 8:
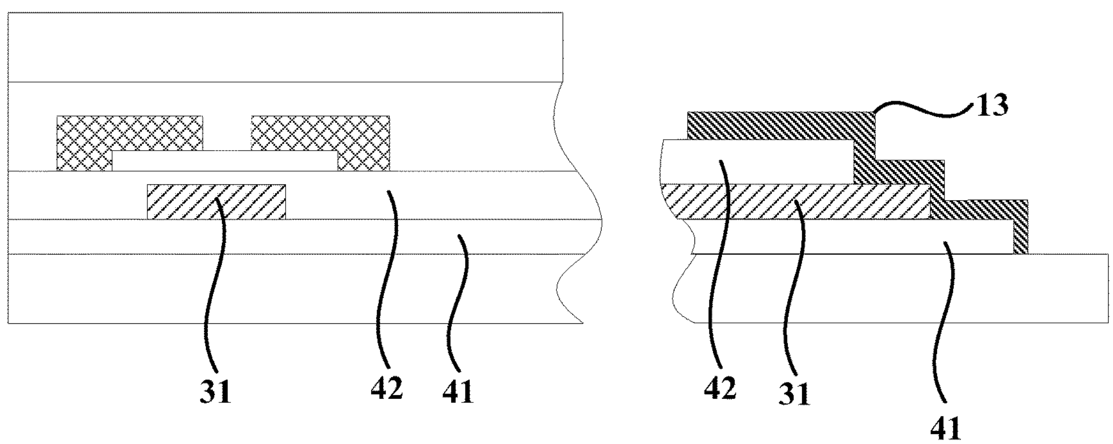
FIG. 8 illustrates a cross-sectional view of another exemplary chamfer cutting reflective layer formed by an exemplary display panel fabrication method consistent with disclosed embodiments.

FIG. 8 illustrates a cross-sectional view of another exemplary chamfer cutting reflective layer formed by an exemplary display panel fabrication method consistent with disclosed embodiments. As shown in FIG. 8, when a plurality of films (such as a buffer layer 41, a gate metal layer 31, and a gate insulating layer 42) are formed in the display region of the display panel, at least one corner of the display surface of the display panel may be simultaneously disposed with a stepped chamfer area. That is, at least one corner of the display surface of the display panel may be deposited with the buffer layer 41, the gate metal layer 31, and the gate insulating layer 42 to form the stepped chamfer area. Then the chamfered cutting reflective layer 13 may be formed on the stepped chamfered region, and the chamfer cutting reflective layer 13 may have the same stepped shape as the stepped chamfer area. That is, the upper surface of the chamfer cutting reflective layer 13 may also have a stepped shape.

It should be noted that, in the disclosed embodiments, when a plurality of films (metal layers, or insulating layers) are formed in the display region of the display panel, at least one corner of the display surface of the display panel may be simultaneously disposed with a stepped chamfer area. The chamfer cutting reflective layer 13 and a certain metal layer in the display region of the display panel may be formed simultaneously, or the chamfer cutting reflective layer 13 may be formed by introducing an extra fabrication process.

It should be noted that, the stepped upper surface of the chamfer cutting reflective layer 13 may be fabricated in various ways. For example, in one embodiment, the stepped upper surface of the chamfer cutting reflective layer 13 may be fabricated by etching the same film multiple times. In another embodiment, the stepped upper surface of the chamfer cutting reflective layer 13 may be fabricated by depositing multiple films, as shown in FIG. 7. In another embodiment, the chamfered cutting reflective layer 13 may be formed on the stepped chamfer area, such that the chamfer cutting reflective layer 13 may also have a substantially same stepped shape as the stepped chamfer area. The methods for forming the stepped upper surface of the chamfer cutting reflective layer are for illustrative purposes, which are not intended to limit the scope of the present disclosure.

The present disclosure provides a display panel and a display panel fabrication method. A chamfer cutting reflective layer may be provided on the display surface of the display panel and along the edge of the chamfer surface. In the direction perpendicular to the chamfer cutting line and towards the corners of the display panel, the thickness d of the chamfer cutting reflective layer may be gradually reduced. During the chamfer cutting process, the chamfer cutting reflective layer may effectively reflect the laser, which is irradiated onto the areas of the display panel beyond the chamfered cutting line, to the outside of the display panel, preventing excessive laser from scattering onto the display panel. Thus, the areas of the display panel close to but beyond the chamfer cutting line may be prevented from becoming brittle, and from generating cracks and collapses. Moreover, the nearby circuit components may be prevented from being affected by the thermal diffraction generated during the chamfer cutting process, and the display performance may be no longer degraded.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. A display panel, comprising:

a display region; and a peripheral circuit region surrounding the display region, wherein:

the display panel has a display surface facing viewers and covering the display region and the peripheral circuit region, at least one corner of the display panel is provided with a chamfer having a chamfer surface, the chamfer surface being a new side surface which is going to be introduced to the display panel after the chamfer is formed, a chamfer cutting reflective layer is disposed on the display surface of the display panel and along an edge of the chamfer surface, in a direction perpendicular to a chamfer cutting line towards the at least one corner of the display panel, a thickness of the chamfer cutting reflective layer is reduced, the peripheral circuit region at least comprises a chip holder, a driving chip being disposed in the chip holder, and two corners of the display panel corresponding to the chip holder each is provided the chamfer.

2. The display panel according to claim 1, wherein:

the chamfer cutting reflective layer has a lower surface facing the display panel and an opposite upper surface far away from the display panel; and the upper surface of the chamfer cutting reflective layer has a slope profile.

3. The display panel according to claim 2, wherein:

an angle α between the upper surface and the lower surface of the chamfer cutting reflective layer is approximately in a range of [30°, 45°].

4. The display panel according to claim 2, wherein:

a maximum thickness D between the upper surface and the lower surface of the chamfer cutting reflective layer is approximately in a range of [0.3 μm, 2 μm].

5. The display panel according to claim 2, wherein:

on the display surface of the display panel, the lower surface of the chamfer cutting reflective layer has a length L in a direction perpendicular to the edge of the chamfer surface; and the length L is approximately in a range of [200 μm, 500 μm].

6. The display panel according to claim 1, wherein:

the display panel is an organic light-emitting diode (OLED) display panel comprising a plurality of organic light-emitting units; and the chamfer cutting reflective layer is disposed on a same layer as a reflective electrode of an organic light-emitting unit.

7. The display panel according to claim 6, wherein:

the reflective electrode of the organic light-emitting unit includes a first transparent conductive layer, a metal electrode layer, and a second transparent conductive layer sequentially disposed.

8. The display panel according to claim 1, wherein:

the display panel is a liquid crystal display (LCD) panel comprising a plurality of thin-film-transistors (TFTs); and the chamfer cutting reflective layer is disposed on a same layer as any one of metal electrodes of a TFT.

9. The display panel according to claim 1, wherein:

the chamfer cutting line is a straight line.

10. The display panel fabrication method according to claim 9, wherein providing at least one corner of a display surface of the display panel with a chamfer cutting reflective layer further includes:

providing the at least one corner of the display surface of the display panel with the chamfer cutting reflective layer by a halftone mask, wherein the chamfer cutting reflective layer has a lower surface facing the display panel and an opposite upper surface far away from the display panel; and the upper surface of the chamfer cutting reflective layer has a slope profile.

11. The display panel fabrication method according to claim 9, wherein the display panel comprises a display region and a peripheral circuit region surrounding the display region, providing at least one corner of a display surface of the display panel with a chamfer cutting reflective layer further includes:

forming a plurality of metal films at the display region of the display panel and, simultaneously, providing the at least one corner of the display surface of the display panel with the chamfer cutting reflective layer, wherein the chamfer cutting reflective layer has a lower surface facing the display panel and an opposite upper surface far away from the display panel; and the upper surface of the chamfer cutting reflective layer has a stepped profile.

12. The display panel fabrication method according to claim 9, wherein the display panel comprises a display region and a peripheral circuit region surrounding the display region, providing at least one corner of a display surface of the display panel with a chamfer cutting reflective layer further includes:

forming a plurality of metal films at the display region of the display panel and, simultaneously, providing at least one corner of the display surface of the display panel with a chamfer area having a stepped profile; and forming the chamfer cutting reflective layer on the chamfer area, wherein the chamfer cutting reflective layer has a lower surface facing the display panel and an opposite upper surface far away from the display panel; and the upper surface of the chamfer cutting reflective layer has a stepped profile.

13. A display panel, comprising:

a display region; and a peripheral circuit region surrounding the display region, wherein:

the display panel has a display surface facing viewers and covering the display region and the peripheral circuit region, at least one corner of the display panel is provided with a chamfer having a chamfer surface, the chamfer surface being a new side surface which is going to be introduced to the display panel after the chamfer is formed, a chamfer cutting reflective layer is disposed on the display surface of the display panel and along an edge of the chamfer surface, in a direction perpendicular to a chamfer cutting line and towards the at least one corner of the display panel, a thickness of the chamfer cutting reflective layer is reduced, and an upper surface of the chamfer cutting reflective layer away from the display panel has a stepped profile.

14. The display panel according to claim 13, wherein:

the display panel is an organic light-emitting diode (OLED) display panel comprising a plurality of organic light-emitting units; and the chamfer cutting reflective layer is disposed on a same layer as a reflective electrode of an organic light-emitting unit.

15. The display panel according to claim 13, wherein:

the display panel is an organic light-emitting diode (OLED) display panel comprising a plurality of organic light-emitting units; and the chamfer cutting reflective layer is disposed on a same layer as any one of metal layers in a pixel driving circuit of an organic light-emitting unit.

16. The display panel according to claim 13, wherein:

the display panel is a liquid crystal display (LCD) panel comprising a plurality of thin-film-transistors (TFTs); and the chamfer cutting reflective layer is disposed on a same layer as any one of metal electrodes of a TFT.

17. The display panel according to claim 13, wherein:

the chamfer cutting line is a straight line.

18. The display panel according to claim 1, wherein:

the display panel is an organic light-emitting diode (OLED) display panel comprising a plurality of organic light-emitting units; and the chamfer cutting reflective layer is disposed on a same layer as any one of metal layers in a pixel driving circuit of an organic light-emitting unit.

19. A display panel fabrication method, comprising:

providing at least one corner of a display surface of the display panel with a chamfer cutting reflective layer; and laser cutting the display panel along a chamfer cutting line to form a chamfer, wherein:

the chamfer cutting reflective layer is formed on the display surface of the display panel and along an edge of a chamfer surface, the chamfer surface being a new side surface which is going to be introduced to the display panel after the chamfer is formed, and in a direction perpendicular to a chamfer cutting line and towards the at least one corner of the display panel, a thickness of the chamfer cutting reflective layer is reduced.

* * * * *